(12) United States Patent
Nagahara et al.

(10) Patent No.: US 8,889,229 B2
(45) Date of Patent: Nov. 18, 2014

(54) METHOD FOR FORMATION OF SILICEOUS FILM AND SILICEOUS FILM FORMED BY THE METHOD

(75) Inventors: Tatsuro Nagahara, Kakegawa (JP); Masanobu Hayashi, Kakegawa (JP)

(73) Assignee: AA Electronics Materials USA Corp., Somerville, NJ (US)

( * ) Notice: Subject to any disclaimer, the term of this patent is extended or adjusted under 35 U.S.C. 154(b) by 563 days.

(21) Appl. No.: 12/918,069

(22) PCT Filed: Feb. 27, 2009

(86) PCT No.: PCT/JP2009/053651
§ 371 (c)(1),
(2), (4) Date: Aug. 18, 2010

(87) PCT Pub. No.: WO2009/107768
PCT Pub. Date: Sep. 3, 2009

(65) Prior Publication Data
US 2010/0323168 A1    Dec. 23, 2010

(30) Foreign Application Priority Data

Feb. 29, 2008    (JP) .................................. 2008-049906

(51) Int. Cl.
*B05D 3/02*    (2006.01)
*H01L 21/02*    (2006.01)
(Continued)

(52) U.S. Cl.
CPC ...... *H01L 21/3125* (2013.01); *H01L 21/02164* (2013.01); *C09D 183/16* (2013.01);
(Continued)

(58) Field of Classification Search
CPC .................... H01L 21/3125; H01L 21/76224; H01L 21/02304; H01L 21/02164; H01L 21/02282; H01L 21/02348; H01L 21/316; H01L 21/02222; C09D 183/16; C08G 77/62
USPC .......................... 427/387, 551, 553, 271, 377
See application file for complete search history.

(56) References Cited

U.S. PATENT DOCUMENTS 6,191,002 B1    2/2001    Koyanagi
6,767,641 B1    7/2004    Shimizu et al.
(Continued)

FOREIGN PATENT DOCUMENTS

JP    64-24852 A    1/1989
JP    8-125021 A    5/1996
(Continued)

OTHER PUBLICATIONS

Cross et al. "Fabrication Process for Ultra High Aspect Ratio Polysilazane-Derived MEMS" The 15th IEEE International Conference on MicroElectro Mechanical Systems, 2002, pp. 172-175.*
Machine Language English Abstract from JPO of JP 64-24852 A, which is equivalent to JP 1-24852 A, 1989.

*Primary Examiner* — Robert S Walters, Jr.
(74) *Attorney, Agent, or Firm* — Sangya Jain (57) ABSTRACT

The present invention provides a method for formation of a siliceous film containing nitrogen in a low concentration. The method according to the present invention comprises the steps of: applying a polysilazane composition on an engraved substrate surface, to form a coating layer; hardening the coating layer only in the part adjacent to the substrate surface, to form a covering film along the shape of the engraved substrate; and removing the polysilazane composition of the coating layer in the part not hardened in the above covering film-formation step. According to this method, two or more siliceous films can be formed and layered.

11 Claims, 1 Drawing Sheet

(51) Int. Cl.
  *C09D 183/16*   (2006.01)
  *H01L 21/316*   (2006.01)
  *H01L 21/312*   (2006.01)
  *H01L 21/762*   (2006.01)
  *C08G 77/62*    (2006.01)

(52) U.S. Cl.
  CPC .......... *H01L 21/02348* (2013.01); *C08G 77/62* (2013.01); *H01L 21/02282* (2013.01); *H01L 21/02304* (2013.01); *H01L 21/316* (2013.01); *H01L 21/02222* (2013.01); *H01L 21/76224* (2013.01)
  USPC .......... 427/387; 427/271; 427/377; 427/551; 427/553

(56) References Cited

U.S. PATENT DOCUMENTS

| | | |
|---|---|---|
| 2004/0072429 A1 | 4/2004 | Hieda et al. |
| 2005/0116300 A1 | 6/2005 | Hieda et al. |

FOREIGN PATENT DOCUMENTS

| | | |
|---|---|---|
| JP | 11-307626 A  | 11/1999 |
| JP | 3178412 B2   | 4/2001 |
| JP | 2001-308090 A | 11/2001 |
| JP | 2002-35683 A | 2/2002 |
| JP | 2005-166700 A | 6/2005 |
| JP | 2007-36267 A | 2/2007 |
| JP | 2007-165422 A | 6/2007 |
| JP | 2008-10884 A | 1/2008 |

\* cited by examiner

METHOD FOR FORMATION OF SILICEOUS FILM AND SILICEOUS FILM FORMED BY THE METHOD

This application is a United States National Stage Patent Application under 35 U.S.C. §371 of International Patent Application No. PCT/JP2009/053651, filed Feb. 27, 2009, which claims priority to Japanese Patent Application No. 2008-049906, filed Feb. 29, 2008, the contents of both documents being hereby incorporated herein by reference.

TECHNICAL FIELD

This invention relates to a method for formation of a siliceous film in an electronic device. Specifically, the present invention relates to a method for forming a siliceous film in manufacture of an electronic device such as a semiconductor element. The siliceous film according to the present invention is employed for preparation of an insulating film provided in an electronic device, for example, of a shallow trench isolation structure.

BACKGROUND ART

In an electronic device such as a semiconductor element, semiconductor parts such as transistors, resistors and the like are arranged on a substrate. Those parts must be electrically isolated from each other, and hence among them it is necessary to form an area separating them. This area is referred to as an "isolation area". Hitherto, the isolation area has been generally provided by forming an insulating film selectively on the surface of the semiconductor substrate.

Meanwhile, recently in the field of electronic device technology, the density and the integration degree have been more and more increased. According as the density and the integration degree are becoming higher, it is getting more difficult to form an isolation structure having fineness corresponding to the required integration degree. It is, therefore, desired to provide a new isolation structure satisfying the required fineness. As one of the isolation structures capable of satisfying the requirement, a trench isolation structure is proposed. The trench isolation structure is fabricated by forming fine trenches on a semiconductor substrate and then by filling the trenches with insulating material so as to electrically separate the part positioned on one side from that on the other side of each trench. The structure thus electrically separating the parts can reduce the isolation area, as compared with the conventional insulating film, and accordingly is effective in achieving the integration degree required in these days.

For fabricating the trench isolation structure, a CVD (chemical vapor deposition) method or a high density plasma CVD method, for example, can be used (see, for example, Patent document 1). However, if the trenches having fineness required in these days, for example, the trenches of 30 nm or less are filled in according to those methods, some voids are often contained in the filled trenches. These structural defects are liable to deteriorate the physical strength of the substrate and/or to impair the isolation characteristics.

In order to favorably fill the trenches in, it is proposed (for example, in Patent documents 1 and 2) that a polysilazane composition be applied on the substrate and then converted into silicon dioxide to fill the trenches with. When the polysilazane is converted into silicon dioxide, its volume shrinkage is little enough to avoid cracks formed by the volume shrinkage.

However, in the above method, it is necessary for the coating layer of the composition to undergo an oxidation process so as to be used as a silicon dioxide film. The oxidation process needs oxygen atom-containing ions, radicals or molecules, but these species are supplied only from the surface of the applied composition layer. Accordingly, the thicker the polysilazane layer is, the less the oxygen atoms migrate in the layer from the surface to the interface with the substrate. As a result, nitrogen atoms originally contained in polysilazane compounds in the composition are liable to remain near the interface with the substrate (see, Patent document 3). If the oxidation is thus so insufficient that nitrogen atoms remain near the interface, fixed charges may be generated and strong flat band shift due to the fixed charges may give unfavorable effects to the functions of semiconductor parts such as transistors formed from the silicon dioxide film. Further, Si—NH moieties remain in the film may be gradually oxidized as time elapses, and consequently the characteristics of semiconductor parts may be changed to impair the performance stability thereof.

[Patent document 1] Japanese Patent No. 3178412 (paragraph: 0005 to 0016)
[Patent document 2] Japanese Patent Laid-Open No. 2001-308090
[Patent document 3] Japanese Patent Laid-Open No. 2007-36267
[Patent document 4] Japanese Patent Laid-Open No. 08 (1996)-125021
[Patent document 5] Japanese Patent Laid-Open No. 01 (1989)-24852

DISCLOSURE OF INVENTION

Problem to be Solved by the Invention

In consideration of the aforementioned problems, it is an object of the present invention to provide a method for formation of a siliceous film which contains a small amount of remaining nitrogen atoms and which is homogeneous and dense even in concaved portions, such as a fine trenches, formed on a substrate.

Means for Solving Problem

The present invention resides in a method for formation of a siliceous film, comprising (A) a first coating step, in which a polysilazane composition is applied on a substrate surface having concaved portions and convex portions to form a coating layer, (B) a covering film-formation step, in which said coating layer only in the part adjacent to the substrate surface is hardened to form a conformable film along the shape of said engraved substrate, and (C) an unhardened layer-removal step, in which the polysilazane composition is removed that remains in said coating layer in the part not hardened in the above covering film-formation step.

The present invention also resides in a siliceous film formed by the above method.

The present invention further resides in a siliceous film-coated substrate having a concavo-convex surface in which concaved portions are filled with silicon dioxide, characterized in that the inside surface of each concaved portion is covered with the siliceous film formed by the above method.

Effect of the Invention

According to the present invention, a covering film containing a low concentration of nitrogen and having small flat band shift can be formed on an engraved silicon substrate. Since the covering film has physical homogeneity as well as the above excellent characteristics as semiconductor, it is easy to form a flattening insulating film (pre-metal dielectric film) in transistor parts or in capacitor parts or to provide a trench isolation structure in an electronic device while ensuring favorable isolation ability thereof.

DESCRIPTION OF THE NUMERALS

1: substrate
2: covering film
3: siliceous film formed by the final coating step and the final hardening step

BEST MODE FOR CARRYING OUT THE INVENTION

The following describes, in order, the method of the present invention for formation of a siliceous film.

(A) First Coating Step

The siliceous film-formation method according to the present invention is suitable for providing a trench isolation structure on a substrate. The siliceous film according to the present invention is formed on a substrate having a concavo-convex surface. Silicon substrate with a concavo-convex surface is used for the siliceous film-formation method according to the present invention. Particularly in the case where a trench isolation structure is to be formed by the method according to the present invention, a silicon substrate having an aimed groove pattern is prepared. The groove pattern may be formed by any method, and hence it can be formed, for example, in the manner described in Patent document 1 or 2. The below describes concrete procedures for forming the groove pattern.

First, a silicon dioxide layer is formed on a silicon substrate by, for example, thermal oxidation. The thickness of the layer is generally 5 to 30 nm.

If necessary, on the formed silicon dioxide layer, a silicon nitride layer is formed by, for example, a low pressure CVD method. The silicon nitride layer serves as a mask in the etching step performed later or as a stop layer in the polishing step described later. The silicon nitride layer generally has a thickness of 100 to 400 nm, if formed.

The formed silicon dioxide or silicon nitride layer is then coated with a photoresist. After dried or hardened according to necessity, the applied photoresist layer is exposed to light and developed to form a desired pattern. The exposure may be performed in any manner. For example, mask exposure or scanning exposure can be carried out. Also as for the photoresist, any resist can be selected from the viewpoint of, for example, resolution.

By use of the patterned resist layer as a mask, the silicon nitride layer and the underlying silicon dioxide layer are successively etched to form the desired pattern on the silicon nitride and silicon dioxide layers.

Further, by use of the patterned silicon nitride and silicon dioxide layers as a mask, the silicon substrate is subjected to dry-etching to form trench isolation grooves.

The widths of the trench isolation grooves are determined by the pattern formed by exposure of the photo-resist. Trench isolation grooves in semiconductor elements generally have different widths depending on the elements, but their widths are normally 0.01 to 1 μm, preferably 0.01 to 0.1 μm. Their depths are normally 0.1 to 10 μm, preferably 0.2 to 1 μm. The method of the present invention can homogeneously fill in narrower and deeper grooves than conventional siliceous film-formation methods. Accordingly, the method of the present invention is suitable for forming a narrower and deeper trench isolation structure. Specifically, for example, in formation of a trench isolation structure having grooves of generally 50 nm or less (particularly 40 nm or less, further particularly 30 nm or less) width and of generally 5 or more (particularly 10 or more) aspect ratio, it is difficult for the conventional siliceous film-formation methods, such as a CVD method, to form a siliceous film homogeneously in deep parts of the grooves. In contrast, the method according to the present invention can form a siliceous film homogeneously even in deep parts of those grooves.

Subsequently, the prepared silicon substrate is then coated with a polysilazane composition, which is a material of the siliceous film, to form a coating layer. The polysilazane composition can be prepared by dissolving any known polysilazane compound in a solvent.

There is no particular restriction on the poly-silazane compound used in the present invention, and any polysilazane compound can be selected to use unless it impairs the effect of the invention. It may be either an inorganic polysilazane compound or an organic one. Preferred examples of the polysilazane compound include polymers comprising combinations of the units represented by the following formulas (Ia) to (Ic):

in which each of m1 to m3 is a number indicating the polymerization degree.

Among them, particularly preferred is a polymer having a weight average molecular weight of 700 to 30000 calibrated from polystyrene standard.

Other examples of the polysilazane compound include: a polysilazane which has a number average molecular weight of approx. 100 to 50000 and which has a skeleton comprising a structure unit represented by the following formula (II):

(II)

(in which n is a number indicating the polymerization degree, and each of R¹, R² and R³ is independently hydrogen, an alkyl group, an alkenyl group, a cycloalkyl group, an aryl group, an alkylsilyl group, an alkylamino group, an alkoxy group, or another group such as a fluoroalkyl group which contains a carbon atom directly connecting to the silicon atom, provided that at least one of R¹, R² and R³ is hydrogen atom); and modified compounds thereof. Two or more polysilazane compounds can be used in combination.

The polysilazane composition used in the present invention comprises a solvent capable of dissolving the above polysilazane compound. It should be noted that this solvent is different from the solvent used in the aforementioned dipping solution. There is no particular restriction on the solvent as long as it can dissolve the above components. Preferred examples of the solvent include:

(a) aromatic compounds, such as benzene, toluene, xylene, ethylbenzene, diethylbenzene, trimethylbenzene and triethylbenzene; (b) saturated hydrocarbon compounds, such as n-pentane, i-pentane, n-hexane, i-hexane, n-heptane, i-heptane, n-octane, i-octane, n-nonane, i-nonane, n-decane and i-decane; (c) alicyclic hydrocarbon compounds, such as ethylcyclohexane, methylcyclohexane, cyclohexane, cyclohexene, p-menthane, decahydronaphthalene, dipentene and limonene; (d) ethers, such as dipropyl ether, dibutyl ether, diethyl ether, methyl tertiary butyl ether (hereinafter, referred to as MTBE) and anisole; and (e) ketones, such as methyl isobutyl ketone (hereinafter, referred to as MIBK). Among them, more preferred are (b) saturated hydrocarbon compounds, (c) alicyclic hydrocarbon compounds, (d) ethers and (e) ketones.

Those solvents can be used in combination of two or more, so as to control the evaporation rate, to reduce the hazardousness to the human body and to control the solubility of the components.

The polysilazane composition used in the present invention can contain other additives, if necessary. Examples of the optional additives include cross linking accelerators (which promote the cross linking reaction of the polysilazane), catalysts for the reaction converting into silicon dioxide, and viscosity modifiers (which control viscosity of the composition). Further, when used for a semiconductor devise, the composition can contain a phosphorus compound such as tris(trimethyl-silyl)phosphate for the sake of Na-getter effect.

The amount of each component described above depends on the conditions of coating and firing. However, the content of the polysilazane compound is preferably 0.1 to 40 wt %, more preferably 0.2 to 30 wt %, and further preferably 0.3 to 25 wt %, based on the total weight of the polysilazane composition. The amounts of additives are different from each other according to their functions, but the content of each additive is preferably 0.001 to 40 wt %, more preferably 0.005 to 30 wt %, most preferably 0.01 to 20 wt % based on the weight of the polysilazane compound.

The above polysilazane composition can be applied on the substrate according to known methods, such as spin coating, curtain coating, dip coating and the like. Among them, spin coating is preferred in view of homogeneity of the coating layer. The thickness of the coating layer is generally 10 to 1000 nm, preferably 50 to 800 nm.

(B) Covering Film-Formation Step

Figure 1:
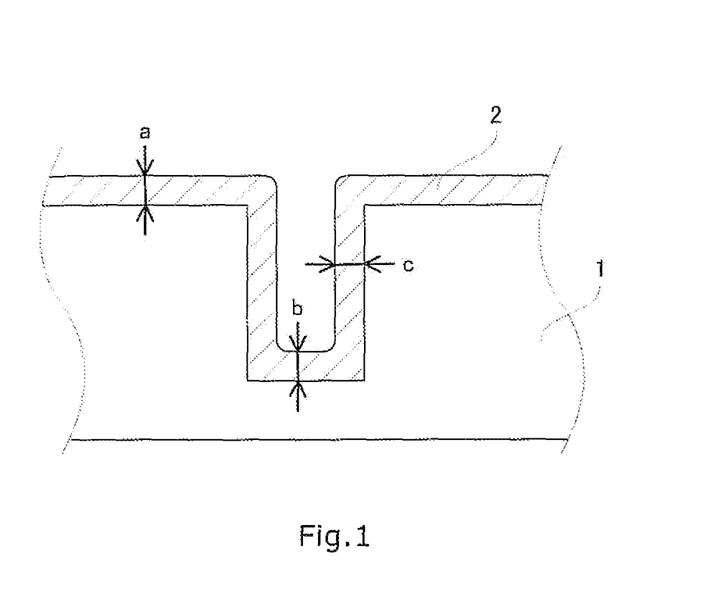
FIG. 1 is a sectional view schematically illustrating a covering film according to the present invention.

Subsequently, the boating layer of the polysilazane composition is hardened only in the part adjacent to the substrate surface, to form a covering film along the shape of the engraved substrate. In this step, it is unnecessary to convert the polysilazane completely into silicon dioxide and it is enough to harden the layer to such a degree that a covering film can be left on the substrate in the following unhardened layer-removal step (described later in detail). The covering film thinly and evenly covers the engraved substrate surface along the shape thereof. This means that, as shown in FIG. 1, a covering film 2 of even thickness is so formed on a substrate 1 as to cover the surface thereof including the inside walls and bottoms of the grooves or holes. In other words, a covering film is so formed that its thicknesses a, b and c are almost the same. Here, a, b and c individually indicate the film thickness at the surface other than the grooves or holes, that at the bottoms of the grooves or holes, and that at the inside walls of the grooves or holes, respectively.

For the sake of convenience in the present invention, it is judged based on the conformability of the covering film whether or not the film is formed along the shape of the substrate. The conformability is numerically expressed by the absolute value of a–b divided by a+b, that is, by the value according to the formula of:

$$|(a-b)/(a+b)|.$$

Fine structures comprising siliceous films formed by the method of the present invention can be employed in various semiconductor devices, and hence preferred conformability depends on the functions of the devices. However, if the value obtained by the above formula is 0.2 or less, the conformability is generally so favorable that the semiconductor device can have excellent characteristics.

The thickness of the covering film is generally 1 to 50 nm, preferably 2 to 20 nm. This means that the grooves or holes formed on the substrate are by no means filled but their inside surfaces are covered with the covering film. Since only covering the inside surfaces of grooves or holes, the covering film has a thickness neither more than half of the groove width nor more than the hole radius. The thickness is not more than the depth of them, either. If having a thickness more than them, the film cannot cover the surface along the shape of the substrate. In other words, if a film formed by only once performing the covering film-formation step is thick enough to almost fill in the grooves or holes, it can be no longer regarded as the covering film and hence is out of scope of the present invention. The thick film cannot diffuse oxygen sufficiently therein. On the other hand, if the covering film-formation step is repeated to form films with which the grooves or holes are almost filled, oxygen can be fully diffused in each film during each formation step and therefore the object of the present invention can be achieved.

The covering film can be formed by any procedure. The below describes concrete examples of the covering film-formation step.

(B1) Covering Film-Formation Step by Substrate Heating

The substrate on which the polysilazane composition is applied in the first coating step may be heated at a relatively low temperature for relatively short time, and thereby the polysilazane coating layer can be hardened only in the part adjacent to the substrate. The heating temperature and time depend on various conditions such as the kind of the polysilazane composition and the thickness of the substrate, but the temperature is normally 35 to 120° C., preferably 50 to 120°

C. and the time is normally 0.1 to 10 minutes, preferably 0.5 to 5 minutes. If the temperature is too low, the polymerization is not taken place and the whole polysilazane is re-dissolved in a solvent in the following unhardened layer-removal step. On the other hand, if the temperature is too high, the whole coating layer is polymerized regardless of the substrate shape and, as a result, it results in failure to obtain a covering film. Accordingly, it is necessary to be careful in selecting the heating conditions.

(B2) Covering Film-Formation Step by Light Exposure

The substrate on which the polysilazane composition is applied in the first coating step may be exposed to light of such a wavelength that the substrate absorbs the light but the polysilazane coating layer essentially does not, and thereby the polysilazane coating layer can be hardened only in the part adjacent to the substrate. This is because the light absorbed by the substrate is converted into thermal energy, which heats the coating layer only in the part adjacent to the substrate. In addition, photoelectron effect may contribute to the polymerization although its contribution is small. The wavelength of the exposure light depends on various conditions such as the kind of the polysilazane composition and that of the substrate, but is normally 220 to 1100 nm, preferably 300 to 800 nm. For example, light of 365 nm is usable. Further, the energy of the exposure light is preferably 1 to 5000 $mJ/cm^2$, more preferably 10 to 4000 $mJ/cm^2$. Here, if the coating layer absorbs the light in an amount of 1% or less, preferably 0.1% or less based on the exposure amount, it is considered that the layer essentially does not absorb the light.

Patent documents 4 and 5 disclose a technique in which the polysilazane composition is exposed to UV light in the presence of ozone and is thereby hardened. However, in the presence of ozone, the polysilazane coating layer is hardened gradually from the surface. The hardening in this technique is therefore based on mechanisms different from the reactions in the present invention.

(B3) Covering Film-Formation Step by Substrate Surface Modification

Prior to the first coating step, the surface of the substrate may be modified with hydroxyl group. Since the polysilazane compound reacts with hydroxyl group, the polysilazane coating layer spread on the modified surface can be hardened only in the part adjacent to the substrate. In this step, hydroxyl group are beforehand provided on the substrate surface. Accordingly, as soon as the composition is applied, the polysilazane compound in the composition starts to react with the hydroxyl group on the substrate surface to form siloxane. Since the siloxane is insoluble, the coating layer can be developed with a developing solution to obtain a covering film of siloxane along the substrate shape. As described above, the covering film starts to be formed immediately after the composition is applied. Accordingly, although the covering film-formation step (B) is generally carried out after the first coating step (A), it is necessary to modify the substrate surface with hydroxyl group before the step (A) in this case.

For the purpose of providing hydroxyl group on the substrate surface, namely, for modifying the substrate surface with hydroxyl group, the substrate surface may be exposed to high energy radiation such as UV light, for example. When the high energy radiation is applied, the silicon substrate surface is excited and, at the same time, oxygen in air is converted into ozone. The excited silicon substrate surface and ozone are reacted to form Si—O bonds, which are presumed to further react with atmospheric moisture and consequently to be converted into Si—OH bonds. The wavelength of UV light used in this hydroxylation depends on the kind of the substrate, but is normally 150 to 200 nm, preferably 170 to 190 nm. The energy of the exposure UV light is preferably 0.05 to 10 $J/cm^2$, more preferably 0.1 to 5 $J/cm^2$.

The exposure can be generally carried out in air. However, since oxygen absorbs light of 200 nm or less, sufficient light cannot reach to the substrate because of high oxygen concentration in atmosphere and/or long distance between the substrate and the light source. Although oxygen molecules absorb the light to form ozone even in that case, the substrate surface may be excited insufficiently that the hydroxylation cannot proceed efficiently. Accordingly, it is preferred to properly control the oxygen concentration: in the atmospheric and the distance between the substrate and the light source. The substrate is exposed to the light generally at room temperature. If the substrate temperature is too high, the Si—OH formed by the hydroxylation may be converted into Si—O—Si and consequently the efficiency of hydroxylation may be lowered. Accordingly, in the light exposure, the substrate temperature is preferably 90° C. or less. If necessary, the substrate surface after exposure may be washed with water and dried at 50 to 100° C.

After the covering film is formed, another covering film can be formed thereon. Even in that case, the surface of the film formed before can be modified with hydroxyl group in the same manner as the substrate surface. The covering film is made of silicon dioxide or unhardened polysilazane, and hence the bonds such as Si—H and Si—NH are broken by high energy radiation to be hydroxylated.

The film-forming procedures of (B1) to (B3) can be carried out in combination to form a single covering film. Further, as described later, when two or more covering films are to be formed and layered, the films can be individually formed by the procedures different from each other. The procedures are preferably carried out in combination because they can provide a covering film in constant quality. Among them, the (B3) procedure is preferred because a covering film can be easily and stably produced according to it. When a covering film is to be formed by a combination of the above procedures, the combination preferably comprises the (B1) and (B3) procedures.

(C) Unhardened Layer-Removal Step

Thereafter, the polysilazane composition is removed that remains unhardened in the previous step. In order to remove the unhardened composition, the coating layer is generally washed with a solvent capable of dissolving the polysilazane. This solvent can be freely selected from the aforementioned examples of solvents usable for the polysilazane composition.

If the unhardened polysilazane composition is insufficiently removed, the resultant siliceous film is often so inhomogeneous that the part on the flat surface is different from that in the grooves. On the other hand, however, if the composition is removed too severely, the covering film formed in the previous step may be removed. Accordingly, it is necessary to be careful in washing the coating layer. In consideration of that, the unhardened layer-removal step generally comprises the procedures of: dipping the coating layer in a solvent capable of dissolving the polysilazane, leaving the layer in the solvent for a predetermined time, and pulling up the layer from the solvent. The dipping time is normally 0.5 to 5 minutes, preferably 1 to 3 minutes. While the coating layer is being dipped, the solvent may be stirred with paddles. Further, it is also possible to spray the solvent onto the coating layer to remove the unhardened composition. In any type of the unhardened layer-removal step, the conditions are preferably so controlled that the formed covering film can be left but that the unhardened composition can be sufficiently removed.

On the engraved substrate, a covering film is thus formed along the shape of the substrate by the above steps.

The covering film is not completely oxidized, but under some film-forming conditions the polysilazane is converted into silicon dioxide to such a degree that the covering film can function as an insulating film.

(D) Covering Film-Hardening Step

After the unhardened layer is removed, the covering film formed in the covering film-formation step can be further hardened, if necessary. The covering film is so thin that a sufficient amount of oxygen can reach the interface with the substrate, and consequently it becomes possible to form a siliceous film having excellent characteristics. The film is preferably hardened in a hardening furnace or on a hot-plate in an inert gas or oxygen, gas atmosphere containing steam. Steam plays an important role for sufficiently converting silicon-containing compounds, silicon-containing polymers and, if present, polysilazane compounds into a siliceous (i.e., silicon dioxide) film. The steam concentration is preferably not less than 1%, more preferably not less than 10%, most preferably not less than 20%. If the steam concentration is 20% or more, the polysilazane compounds are converted into a siliceous film smoothly that number of defects such as voids is suppressed and characteristics of the resultant film is improved. The inert gas usable as the atmospheric gas is, for example, nitrogen, argon or helium.

The hardening temperature condition depends on the kind of the polysilazane composition and on the combination of the procedures. However, at a high temperature, the silicon-containing compounds, silicon-containing polymers and polysilazane compounds are tend to be converted into a siliceous film rapidly. On the other hand, at a low temperature, the characteristics of the resultant device are apt to be less impaired because of oxidation of the silicon substrate or change of the crystal structure of silicon. In consideration of that, the covering film is heated at a temperature of normally 1000° C. or below, preferably 400 to 900° C. To the determined temperature, the temperature is elevated normally at a rate of 1 to 100° C./minute. At the determined temperature, the film is heated to harden for normally 1 minute to 10 hours, preferably 15 minutes to 3 hours. If necessary, the hardening temperature and the composition of the hardening atmosphere may be changed step-by-step.

From the above heating procedure, the polysilazane compound contained in the coating layer can be converted into silicon dioxide to obtain the resultant siliceous film.

It is also possible to convert the polysilazane compound into silicon dioxide without heating. For example, the covering film may be left in an ozone atmosphere or may be dipped in an aqueous hydrogen peroxide solution so as to be converted.

In those procedures, the conditions for hardening the covering film cannot be determined indiscriminately because they depend on the thickness of the film and on the kind of the polysilazane composition. However, if the film is hardened with ozone, the temperature is normally 15 to 200° C., preferably 20 to 150° C. In that case, the film is left in an ozone concentration of 0.01 to 20 mg/L, preferably 0.1 to 20 mg/L for 0.5 to 60 minutes, preferably 1 to 30 minutes. On the other hand, if hardened with hydrogen peroxide, the film is dipped in an aqueous hydrogen peroxide solution of generally 5 to 70 wt %, preferably 30 to 60 wt % at a temperature of 15 to 60° C., preferably 20 to 60° C. for 1 to 60 minutes, preferably 2 to 30 minutes.

On the concavo-convex substrate, a siliceous film containing a small amount of nitrogen (namely nitrogen concentration in siliceous film) is thus formed along the shape of the substrate by the aforementioned steps. The siliceous film according to the present invention achieves a remarkably low nitrogen concentration, as compared with siliceous films formed by conventional methods from polysilazane compositions. The siliceous film formed by the method of the present invention contains nitrogen atoms in an amount of generally $1 \times 10^{19}$ atoms/cm$^3$ or less, preferably $8 \times 10^{18}$ atoms/cm$^3$ or less.

In the present invention, the aforementioned steps (A) to (D) may be repeated to form another covering film on the above-produced covering film, if necessary. In the case where two or more covering films are layered, each film can be made so thin that a sufficient amount of oxygen atoms can be supplied from the surface and diffused in the thickness direction to every part when the film is hardened. Consequently, it becomes possible to obtain siliceous films of excellent characteristics.

(E) Final Coating Step

After one or more hardened covering films are formed on the substrate in the manner described above, the substrate is then subjected to a final coating step, if necessary. In the final coating step, another polysilazane composition is applied on the substrate surface, so as to fill the grooves in and thereby to coat the substrate with a flat siliceous film. This step aims only to fill in trenches remaining in the grooves after the covering film-hardening step, and hence the polysilazane composition and the coating conditions can be selected from those described above. Accordingly, the polysilazane composition used in this step may comprise the same components as that used for forming the above covering film.

(F) Final Hardening Step

After the final coating step is completed, the substrate is subjected to the pre-baking step (described later in detail), if necessary. The whole substrate is then heated so that the whole polysilazane coating layer may be completely converted and densified into a siliceous film.

Normally, the whole substrate is heated in a hardening furnace. The hardening conditions can be selected from those described above for the covering film-hardening step.

In the method of the present invention for formation of a siliceous film, the above steps (A) to (C) are indispensable. If necessary, the steps (D), (E) and (F) can be carried out in combination. Further, other steps can be carried out in combination according to necessity. The following describes those optional steps.

(a) Pre-Baking Step

After the final coating step but before the final hardening step, the substrate coated with the polysilazane composition can be subjected to pre-baking. This step aims to completely remove the solvent in the coating layer and to preliminarily harden the layer formed in the final coating step. Since pre-baking improves density of the resultant siliceous film, the pre-baking step is preferably included in the method of the present invention.

In the pre-baking step, the substrate is normally heated at a constant temperature. However, the pre-baking temperature is preferably controlled and gradually elevated in order to avoid hollows on the substrate surface at the grooves or holes and/or to avoid voids in the grooves because of shrinkage of the coating layer during hardening. The pre-baking temperature is normally 50 to 400° C., preferably 100 to 300° C. The pre-baking time is normally 10 seconds to 30 minutes, preferably 30 seconds to 10 minutes The pre-baking temperature can be gradually elevated by heating the atmosphere in which the substrate is placed either by step-by-step or increasing the temperature monotonously. In view of removing the solvent from the coating layer, the highest pre-baking temperature in this step is generally higher than the boiling point of the solvent used in the polysilazane composition.

If the pre-baking step is included in the method of the present invention, it is preferred that the substrate heated in pre-baking be immediately subjected to the hardening step before cooled. The temperature of the hot substrate is lower than the highest pre-baking temperature but is preferably 50° C. or more. The substrate before cooled is subjected to the hardening step, so as to save energy and time for elevating the temperature again.

(b) Polishing Step

After the coating layer is hardened to form a siliceous film, an unnecessary part of the siliceous film is preferably removed. For the purpose of that, the film is polished so as to remove the part formed on the flat surface of the substrate but as to leave the part formed in the grooves or holes. This is the polishing step. The polishing step may be carried out before the hardening step or immediately after pre-baking if the pre-baking step is performed.

The polishing step is performed according to chemical mechanical polishing (CMP), which can be carried out with common abrasives and machines. Examples of the abrasives include silica, alumina, ceria, and aqueous dispersion thereof, if necessary, additives. As the polishing machines, commercially available CMP apparatus can be adopted.

(c) Etching Step

The above polishing step removes the siliceous film in almost the whole part converted from the polysilazane composition applied on the flat surface of the substrate. However, in order to remove the siliceous film remaining on the flat surface of the substrate, the etching step is preferably performed. The etching procedure is generally carried out by use of an etching solution. There is no particular restriction on the etching solution as long as it can remove the siliceous film, but normally the etching solution is an aqueous hydrofluoric acid solution containing ammonium fluoride. The ammonium fluoride concentration in the solution is preferably not less than 5%, more preferably not less than 30%.

A siliceous film formed on a concavo-convex substrate by conventional methods often has different characteristics between inside the grooves or holes and outside of them. Further, nitrogen atoms remained in the conventional film are liable to enlarge flat band shift. For those reasons, the conventional film often impairs the resultant product quality. In contrast, a siliceous film formed by the method according to the present invention has homogeneous characteristics and improved flat band shift, and therefore enables to manufacture products having desired performance characteristics.

Example 1

Silicon substrates were prepared, each of which had a fine structure comprising grooves of 100 nm width and 500 nm depth. Also, a polysilazane composition was prepared that contained polysilazane dissolved in dibutyl ether. The polysilazane was represented by the formula (II) in which each of $R^1$ and $R^3$ was H and $R^2$ was $CH_3$, and had a weight average molecular weight of 3200 calibrated from polystyrene standard. The polysilazane composition was applied on four of the silicon substrates, so that each formed layer might have a thickness of 500 nm in the part on the flat surface of the substrate. Thereafter, the substrates were individually heated at 30° C. (Example 1A), at 50° C. (Example 1B), at 70° C. (Example 1C) and at 130° C. (Example 1D) for 1 minute, to form covering films. The dried substrates were individually dipped in dibutyl ether for 1 minute, to remove unhardened portions. With respect to each of the substrates, the section was observed by a scanning electron microscope (high resolution field emission scanning electron microscope S-4800 [trademark], manufactured by Hitachi, Ltd.), to measure the film thickness a on the surface other than the grooves and that b on the bottoms of the grooves and thereby to evaluate the conformability.

TABLE 1

| Example | 1A | 1B | 1C | 1D |
|---|---|---|---|---|
| Pre-baking temperature (° C.) | 30 | 50 | 70 | 130 |
| Thickness a (nm) | N/A*[1] | 10 | 32 | N/A*[2] |
| Thickness b (nm) | N/A*[1] | 11 | 40 | N/A*[2] |
| Conformality | N/A*[1] | 0.05 | 0.11 | N/A*[2] |

(Remarks)
*[1]After the unhardened portion was removed, the covering film was not left.
*[2]There was little unhardened portion, and the coating layer had a thickness of 512 nm on the flat surface of the substrate. The grooves were completely filled with the hardened layer, which had a thickness of 1023 nm from the bottoms of the grooves to the surface of the layer. Consequently, it resulted in failure to form a covering film along the shape of the substrate, and hence the conformability could not be evaluated.

Example 2

The procedure of Example 1 was repeated to prepare two silicon substrates which had the fine structures and which were coated with a polysilazane composition. The polysilazane used in this example was perhydropolysilazane having a weight average molecular weight of 1300 calibrated from polystyrene standard. The substrates were individually exposed to light of 172 nm (Example 2A) and 254 nm (Example 2B). The light sources were an excimer UV irradiation unit (manufactured by Ushio Inc.) for 172 nm and an amalgam lamp (manufactured by Heraeus K. K.) for 254 nm. The exposure time was 30 seconds, and the exposure amount was 300 mJ/cm². The light of 172 nm was absorbed by the polysilazane coating layer, while that of 254 nm was absorbed not by the polysilazane coating layer but by the silicon substrate. After exposure, the substrates were dipped in xylene for 1 minute, to remove unhardened portions. With respect to each of the substrates, the section was observed by a scanning electron microscope, to measure the film thickness a on the surface other than the grooves and that b on the bottoms of the grooves and thereby to evaluate the conformability.

TABLE 2

| Example | 2A | 2B |
|---|---|---|
| Exposure light wavelength (nm) | 172 | 254 |
| Thickness a (nm) | 480 | 7 |
| Thickness b (nm) | 920 | 5 |
| Conformality | 0.31 | 0.17 |

Example 3

A silicon substrate was prepared that had a fine structure comprising grooves of 28 nm width and 500 nm depth. The substrate was exposed in air to light of 172 nm by means of an excimer UV irradiation unit (manufactured by Ushio Inc.), and thereby its surface was subjected to hydroxylation treatment. Thereafter, in the same manner as in Example 2, the substrate was coated with the polysilazane composition and then the unhardened portion was removed (Example 3B). Independently, another substrate for comparison was prepared and not exposed to UV light. In the same manner as in Example 1, the comparative substrate was coated with the polysilazane composition and then the unhardened portion was removed (Example 3A). With respect to each of the substrates, the section was observed by, a scanning electron microscope, to measure the film thickness a on the surface other than the grooves and that b on the bottoms of the grooves and, thereby to evaluate the conformability. However, in Example 3A, the polysilazane composition was not hardened at all and hence it resulted in failure to form a covering film.

TABLE 3

| Example | 3A | 3B |
|---|---|---|
| Hydroxylation | not done | done |
| Thickness a (nm) | N/A | 1 |
| Thickness b (nm) | N/A | 1 |
| Conformality | N/A | 0.00 |

Example 4

The polysilazane composition used in Example 2 was spin-coated on a silicon substrate having a flat surface, to form a coating layer of 500 nm thickness. After pre-baked at 90° C. on a hot-plate for 1 minute, the substrate was dipped in dibutyl ether for 3 minutes. The substrate was pulled up from the solvent and dried, to obtain a polysilazane layer of 49 nm thickness. The layer was then steam-oxidized at 400° C. for 1 hour in 80 volume % steam by use of a steam-oxidation furnace (VF-1000 [trademark], manufactured by Koyo Thermo Systems Co., Ltd.). The resultant layer (first layer) was analyzed by IR spectroscopy, and thereby it was verified that the layer was converted into a silicon dioxide film.

On the formed film, the polysilazane composition used in Example 2 was spin-coated again to form another polysilazane layer of 500 nm. After pre-baked at 150° C. for 3 minutes, the formed layer was heated at 400° C. for 1 hour in a flow of 80 mol % steam-containing oxygen gas ($H_2O/(O_2+H_2O)=80\%$) at a rate of 8 L/minute and subsequently heated at 800° C. for 1 hour in $N_2$ gas atmosphere, to form a second layer (Example 4A). As for the obtained sample, the nitrogen concentration in the silicon dioxide film (first layer), which was formed from polysilazane, was measured at the interface with the substrate by means of a secondary ion mass spectrometer (hereinafter referred to as "SIMS"). As a result, it was found to be $5 \times 10^{18}$ atoms/cm$^3$.

Independently, a sample for comparison was prepared. The comparative sample was not provided with the first layer. For preparing the comparative sample, the above procedure for forming the second layer was repeated to form a silicon dioxide film on a silicon substrate (Example 4B). As for the obtained comparative sample, the nitrogen concentration in the silicon dioxide film (second layer), which was formed from polysilazane, was measured at the interface with the substrate. As a result, it was found to be $2 \times 10^{20}$ atoms/cm$^3$.

From the above results, it was verified that the first layer reduced the concentration of impurity at the interface with the substrate. In this example, flat substrates were used so that the concentration of remaining nitrogen could be easily measured by SIMS. However, even if engraved substrates are used, the same results can be obtained.

Example 5

The procedure of Example 4 was repeated only except for changing the oxidizing process of the first layer to form a silicon dioxide film, in the manner described below. A silicon substrate was spin-coated with the polysilazane composition to form a layer of 500 nm thickness. After pre-baked on a hot-pate at 90° C. for 1 minute, the substrate was dipped in dibutyl ether for 3 minutes. The substrate was then pulled up from the solvent and dried, to obtain a polysilazane layer of 49 nm thickness. Subsequently, the layer was exposed to UV light of 172 nm for 3 minutes by means of an excimer UV irradiation unit (manufactured by Ushio Inc.), and then analyzed by IR spectroscopy. As a result, it was verified that the layer was converted into a silicon dioxide film. On the obtained film, a second layer was formed in the same manner as in Example 4A (Example 5A). As for the obtained sample, the nitrogen concentration in the silicon dioxide film, which was formed from polysilazane, was measured at the interface with the substrate. As a result, it was found to be $5 \times 10^{17}$ atoms/cm$^3$. This nitrogen concentration is significantly smaller than that in Example 4B.

Example 6

The procedure of Example 4 was repeated only except for changing the oxidizing process of the first layer to form a silicon dioxide film, in the manner described below. A silicon substrate was spin-coated with the polysilazane composition to form a layer of 500 nm thickness. After pre-baked on a hot-pate at 90° C. for 1 minute, the substrate was dipped in dibutyl ether for 3 minutes. The substrate was then pulled up from the solvent and dried, to obtain a polysilazane layer of 49 nm thickness. Subsequently, after the substrate was packed in an atmosphere-controllable airtight container, air containing 10 mg/L ozone was supplied into the container for 30 minutes. The resultant layer was then analyzed by IR spectroscopy, and it was verified that the layer was converted into a silicon dioxide film. On the obtained film, a second layer was formed in the same manner as in Example 4A (Example 6A). As for the obtained sample, the nitrogen concentration in the silicon dioxide film, which was formed from polysilazane, was measured at the interface with the substrate. As a result, it was found to be $2 \times 10^{18}$ atoms/cm$^3$. This nitrogen concentration is significantly smaller than that in Example 4B.

Example 7

The procedure of Example 4 was repeated only except for changing the oxidizing process of the first layer to form a silicon dioxide film, in the manner described below. A silicon substrate was spin-coated with the polysilazane composition to form a layer of 500 nm thickness. After pre-baked on a hot-pate at 90° C. for 1 minute, the substrate was dipped in dibutyl ether for 3 minutes. The substrate was then pulled up from the solvent and dried, to obtain a polysilazane layer of 49 nm thickness. Subsequently, the substrate was dipped in 50 wt % aqueous hydrogen peroxide solution for 30 minutes. The resultant layer was then analyzed by IR spectroscopy, and it was verified that the layer was converted into a silicon dioxide film. On the obtained film, a second layer was formed in the same manner as in Example 4A (Example 6A). As for the obtained sample, the nitrogen concentration in the silicon dioxide film, which was formed from polysilazane, was measured at the interface with the substrate. As a result, it was found to be $4 \times 10^{18}$ atoms/cm$^3$. This nitrogen concentration is significantly smaller than that in Example 4B.

Example 8

The substrate used in Example 3B was subjected to a series of the steps of exposing UV light, coating the polysilazane composition, heating for forming the covering film and removing the unhardened layer. The series was repeated six times to form six layered covering films. In those series, the UV-light exposure in the first series hydroxylated the surface of the silicon substrate, but that in the other series hydroxylated the surface of the covering film formed immediately before. The section of the obtained sample substrate was observed by a transmission electron microscope (H-9000UHR [trademark], manufactured by Hitachi, Ltd.), to measure the total film thickness a on the surface other than the grooves and that b on the bottoms of the grooves and thereby to evaluate the conformability.

TABLE 4

| Example | 8A |
|---|---|
| Hydroxylation | 6 times |
| Thickness a (nm) | 10 |
| Thickness b (nm) | 9 |
| Conformality | 0.05 |

Figure 2:
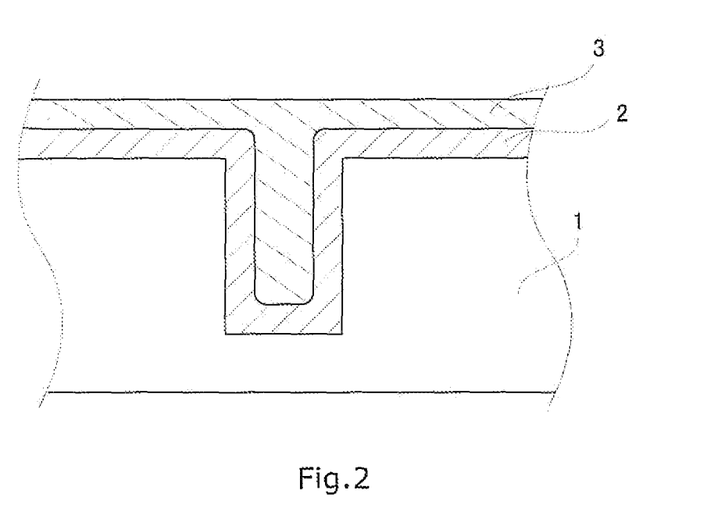
FIG. 2 is a sectional view schematically illustrating the sample of Example 8.

The polysilazane composition used in Example 2 was spin-coated onto the substrate that the coating layer might have a thickness of 500 nm on the flat surface of the substrate (final coating step). After prebaked at 150° C. for 3 minutes, the formed polysilazane layer was heated at 400° C. for 1 hour in a flow of 80 mol % steam-containing oxygen gas ($H_2O/(O_2+H_2O)=80\%$) at a rate of 8 L/minute and subsequently heated at 800° C. for 1 hour in $N_2$ gas atmosphere (final hardening step). The section of the resultant siliceous film-coated substrate was observed by a scanning electron microscope. As a result, it was found that a homogeneous covering film 2 was formed on the substrate 1 and was further covered with a sufficiently flat siliceous film 3 formed by the final coating and hardening steps (FIG. 2). The siliceous film 3 was homogeneous enough not to contain any void in the grooves.

Example 9

The procedure of Example 8 was repeated except for changing the substrate into a flat substrate in the following manner. A flat substrate was subjected to a series of the steps of exposing UV light, coating the polysilazane composition, heating for forming the covering film and removing the unhardened layer. The series was repeated six times to form six layered covering films. Subsequently, the polysilazane composition used in Example 2 was spin-coated onto the substrate, to form a polysilazane layer of 500 nm thickness. After prebaked at 150° C. for 3 minutes, the formed polysilazane layer was heated at 400° C. for 1 hour in a flow of 80 mol % steam-containing oxygen gas ($H_2O/(O_2+H_2O)=80\%$) at a rate of 8 L/minute and subsequently heated at 800° C. for 1 hour in $N_2$ gas atmosphere, to form a second layer (Example 9). As for the obtained sample, the nitrogen concentration in the silicon dioxide film, which was formed from polysilazane, was measured at the interface with the substrate. As a result, it was found to be $9 \times 10^{17}$ atoms/cm$^3$.

The invention claimed is:

1. A method for formation of a siliceous film, comprising
   (A) a first coating step, in which a polysilazane composition is applied on a substrate surface having concaved portions and convex portions to form a coating layer having a thickness of 10- 1000 nm,
   (B) a covering film-formation step, in which said coating layer is hardened only from the surface of the substrate out to 1-50 nm from the surface of the substrate, where the thickness that is hardened is less than the entire thickness of the coating layer, thereby forming a 1 to 50 nm hardened covering film having homogeneous fill along the shape of said substrate surface having concaved portions and convex portions, and
   (C) an unhardened layer-removal step, in which the polysilazane composition that remains in said coating layer in a part not hardened in the above covering film formation step is removed.

2. The method according to claim 1 for formation of a siliceous film, further comprising
   (D) a covering film-hardening step, in which said covering film is further hardened right after the above unhardened layer-removal step.

3. The method according to claims 2 for formation of a siliceous film, wherein the covering film-hardening step (D) is performed under a heated condition in an inert gas or oxygen gas atmosphere containing steam.

4. The method according to claim 1 for formation of a siliceous film, furthermore comprising
   a final coating step, in which another polysilazane composition is applied on said covering film to fill in said concaved portions, and
   a final hardening step, in which said polysilazane composition applied in the above final coating step is converted and densified into silicon dioxide.

5. The method according to claim 4 for formation of a siliceous film, wherein the final hardening step is performed under a heated condition in an inert gas or oxygen gas atmosphere containing steam.

6. The method according to claim 1 for formation of a siliceous film, wherein said substrate is prepared by engraving a flat substrate with grooves having a width of 1 to 100 nm and a depth of 10 nm to 10 μm.

7. The method according to claim 1 for formation of a siliceous film, wherein said covering film-formation step is performed according to at least one procedure selected from the group consisting of
   (B1) heating said substrate at a temperature of 35 to 120° C.,
   (B2) exposing said polysilazane composition applied substrate to light of such a wavelength that said substrate absorbs the light but said coating layer of polysilazane does not, and
   (B3) exposing said substrate to high-energy radiation before the first coating step (A) so as to hydroxylate said substrate surface, and thereafter applying the polysilazane composition thereon.

8. The method according to claim 7 for formation of a siliceous film, wherein said covering film-formation step is performed according to a combination of two or more of (B1) to (B3).

9. The method according to claims 1 for formation of a siliceous film, wherein the steps of (A) to (C) are repeated to form two or more covering films.

10. The method according to claim 1 for formation of a siliceous film, wherein said polysilazane composition contains perhydropolysilazane.

11. The method according to claim 1, where the siliceous film contains nitrogen atoms in a concentration of $1 \times 10^{19}$ atoms/cm$^3$ or less.

* * * * *